United States Patent
Asanuma et al.

(10) Patent No.: US 8,278,665 B2
(45) Date of Patent: Oct. 2, 2012

(54) ORGANIC LIGHT EMITTING DIODE DISPLAY

(75) Inventors: Haruhiko Asanuma, Hitachi (JP); Genshiro Kawachi, Chiba (JP)

(73) Assignees: Hitachi Displays, Ltd., Chiba-ken (JP); Panasonic Liquid Crystal Display Co., Ltd., Hyogo (JP)

( * ) Notice: Subject to any disclaimer, the term of this patent is extended or adjusted under 35 U.S.C. 154(b) by 146 days.

(21) Appl. No.: 12/805,842

(22) Filed: Aug. 20, 2010

(65) Prior Publication Data

US 2011/0073863 A1    Mar. 31, 2011

(30) Foreign Application Priority Data

Sep. 28, 2009  (JP) ................................. 2009-223265

(51) Int. Cl.
*H01L 33/02*    (2010.01)

(52) U.S. Cl. .................. 257/72; 257/101; 257/E33.053; 438/45

(58) Field of Classification Search ..................... 257/72, 257/101, E33.053; 438/45
See application file for complete search history.

(56) References Cited

U.S. PATENT DOCUMENTS

| 6,566,174 | B1 | 5/2003 | Takechi et al. | |
|---|---|---|---|---|
| 7,858,144 | B2 | 12/2010 | Freeman et al. | |
| 2001/0045558 | A1* | 11/2001 | Kawasaki et al. | 257/66 |
| 2002/0090776 | A1* | 7/2002 | Nakata et al. | 438/216 |
| 2006/0019433 | A1* | 1/2006 | Chen | 438/151 |
| 2007/0284586 | A1* | 12/2007 | Park et al. | 257/72 |
| 2009/0020759 | A1* | 1/2009 | Yamazaki | 257/59 |
| 2009/0139447 | A1 | 6/2009 | Toriumi | |
| 2009/0167974 | A1* | 7/2009 | Choi et al. | 349/43 |
| 2009/0261329 | A1* | 10/2009 | Yamakawa et al. | 257/57 |
| 2009/0321739 | A1* | 12/2009 | Kim et al. | 257/59 |
| 2011/0278577 | A1 | 11/2011 | Yamazaki | |

FOREIGN PATENT DOCUMENTS

| JP | 09-090424 | 4/1997 |
|---|---|---|
| JP | 09-186335 | 7/1997 |
| JP | 11-8395 | 1/1999 |
| JP | 11-121761 | 4/1999 |

(Continued)

OTHER PUBLICATIONS

Mohammad R. Esmaeili-Rad et al., Analysis of the off current in nanocrystalline silicon bottom-gate thin-film transistors, Journal of Applied Physics 103, 074502 (2008).

(Continued)

*Primary Examiner* — Steven J Fulk
(74) *Attorney, Agent, or Firm* — Antonelli, Terry, Stout & Kraus, LLP.

(57) ABSTRACT

An organic light emitting diode display includes a thin film transistor on a substrate (1). The thin film transistor includes a gate electrode (2), a gate insulating film (3) that covers the gate electrode (2), a first semiconductor film (4) provided on the gate insulating film (3), a second semiconductor film (5) provided on the first semiconductor film (4), a back channel protection insulating film (7) and an ohmic contact film (8) provided on the second semiconductor film (5), and source/drain electrodes (9). A crystallinity of the first semiconductor film (4) is higher than that of the second semiconductor film (5). The back channel protection insulating film (7) is formed as one of an organic insulating film and an organic/inorganic hybrid insulating film. The thin film transistor has excellent off-state characteristics, swing characteristics, and saturation characteristics.

15 Claims, 9 Drawing Sheets

FOREIGN PATENT DOCUMENTS

| | | |
|---|---|---|
| JP | 2008-124392 | 5/2008 |
| JP | 2009-049384 | 3/2009 |
| JP | 2009-158950 | 7/2009 |
| JP | 2011-506758 | 3/2011 |

OTHER PUBLICATIONS

Kazushige Takechi et al., Back-channel-oxidized *a*-Si:H thin-film transistor, Journal of Applied Physics, Oct. 1, 1998, vol. 84, No. 7.

* cited by examiner

ORGANIC LIGHT EMITTING DIODE DISPLAY

CROSS-REFERENCE TO RELATED APPLICATION

The present application claims priority from Japanese application JP2009-223265 filed on Sep. 28, 2009, the content of which is hereby incorporated by reference into this application.

BACKGROUND OF THE INVENTION

1. Field of the Invention

The present invention relates to a display, and more particularly, to an organic light emitting diode (OLED) display using thin film transistors.

2. Description of the Related Art

In recent years, the displays using an organic light emitting diode which consists of thin organic films with electroluminescence (EL) in each pixel receive attention as a next generation flat panel display to replace a liquid crystal display. The display, that is, an organic light emitting diode display referred to as OLED display, is different from the conventional liquid crystal display in that, because of the self-emission phenomenon, an additional light source is not necessary, which enables decrease in volume and in weight of the display. Further, the organic light emitting diode display has advantages of low power consumption, a wide angle of view, high brightness, fast response, and the like over the liquid crystal display.

Because of these characteristics, the organic light emitting diode display is placed as a mighty next generation display to be used in household electronic appliances such as a cellular telephone and a flat TV set, and is now energetically developed.

Drive systems of the organic light emitting diode display are roughly classified into a passive matrix type and an active matrix type. In a passive matrix organic light emitting diode display, bias voltage is applied to a signal electrode and a scanning electrode at the same time, and an organic layer between the electrodes is caused to emit light. Although the structure is simple and the cost of manufacturing may be suppressed, in a trend toward a larger area display, there are also disadvantages such as relatively high power consumption, low resolution, slow response, and a lowered aperture ratio in accordance with an increased number of wirings. An active matrix organic light emitting diode display has advantages of lower power consumption, higher image quality, faster response, higher light emission efficiency, and the like compared with the passive matrix organic light emitting diode display. Therefore, the active matrix type is regarded as a preferred drive system of a large area organic light emitting diode display.

A pixel circuit of the active matrix organic light emitting diode display includes at least an organic light emitting diode and a plurality of thin film transistors. As the above-mentioned thin film transistors, at least a switch transistor for controlling the brightness of the pixel and a drive transistor for controlling light emission of the organic light emitting diode are necessary.

Here, performance characteristics of the active matrix organic light emitting diode display are briefly described with reference to a drawing. FIG. 14 illustrates an exemplary structure of one basic pixel circuit of the active matrix organic light emitting diode display. As illustrated in FIG. 14, a selection line 106 and a data line 105 which is orthogonal to the selection line 106 are formed on a substrate. A switch transistor 111 is placed at a point at which the data line 105 and the selection line 106 intersect each other. Part of wiring of the switch transistor 111 is connected to a drive transistor 112. A power line 107, a storage capacitor 110, and an organic light emitting diode 109 are also connected to the drive transistor 112. First, a gate signal is applied from the selection line 106 to the switch transistor 111. A current signal flowing through the data line 105 becomes a voltage signal through the switch transistor 111 and is applied to a gate electrode of the drive transistor 112. This causes the drive transistor 112 to operate, a current is allowed to flow through the organic light emitting diode 109, and the organic light emitting diode 109 emits light. Here, the storage capacitor 110 has a function of retaining the signal at the gate electrode. More specifically, the current flowing through the organic light emitting diode 109 is adjusted to be at a fixed level until the next signal is applied even after the switch transistor 111 is turned off.

As described above, because the organic light emitting diode display is a current-driven display, the respective thin film transistors constituting the pixel circuit are required to have the following characteristics. The switch transistor is required to sufficiently suppress an OFF current in order to suppress fluctuations in brightness. The drive transistor is required to have high carrier mobility and a threshold voltage which does not shift in order to flow a enough current that the organic light emitting diode is able to emit light and in order to maintain the current-carrying state. Further, because the drive transistor uses a saturated region of output characteristics, the drive transistor is required to have satisfactory saturation characteristics in which the current value is constant in the saturated region.

Japanese Patent Application Laid-open No. 2008-124392 discloses a semiconductor device including a semiconductor layer with a laminated structure of a low-crystallinity semiconductor layer containing both an amorphous phase and a crystal phase and a high-crystallinity semiconductor layer having a higher crystallization rate than that of the low-crystallinity semiconductor layer, which are formed in an order from the side of a contact layer.

SUMMARY OF THE INVENTION

In the conventional thin film transistor having an active semiconductor layer in which a high-crystallinity semiconductor layer and a low-crystallinity semiconductor layer are laminated, when an ohmic contact film existing on the active semiconductor layer is removed by dry etching, part of the active semiconductor layer is over-etched. Because the active semiconductor layer is damaged by the overetching, a back-channel effect may occur and the back-channel effect affects transistor characteristics. For example, the off-state characteristics, the swing characteristics, or the saturation characteristics may be degraded, or the threshold voltage may be shifted. Further, when the entire low-crystallinity semiconductor layer in the laminated structure is etched out by the overetching, the high-crystallinity semiconductor layer is brought into contact with a protective film in a subsequent step. The high-crystallinity semiconductor layer is more likely to be affected by fixed charge in the protective film than the low-crystallinity semiconductor layer. Therefore, the back-channel effect may be caused by the fixed charge in the protective film, and it affects the transistor characteristics in a similar way. If such a phenomenon occurs, it is difficult to adopt the transistor as the switch transistor and the drive transistor used in the pixel circuit of the current-driven display, in particular, the organic light emitting diode display. It is to be noted that the thin film transistor in which, when the ohmic contact film above a channel is removed, the part of the active semiconductor layer is over-etched as described above is referred to as a channel-etched thin film transistor.

An etch-stopper thin film transistor in which an etch stopper layer which is a silicon nitride film ($SiN_x$ film) or the like is provided above the laminated film including the high-crystallinity semiconductor layer and the low-crystallinity semiconductor layer is provided as a conventional technology which prevents overetching of the laminated film. Because the overetching of the laminated film which occurs in the dry etching is prevented by the etch stopper layer, only the ohmic contact film may be selectively removed, which enables prevention of the damage to the laminated film. However, because the etch stopper layer is formed after the laminated film is formed, it is difficult to form a high-quality insulating film, and a large amount of fixed charge is formed in the etch stopper layer. Therefore, the fixed charge in the etch stopper layer may cause the back-channel effect, and it affects the transistor characteristics, for example, the off-state characteristics, the swing characteristics, or the saturation characteristics may be degraded, or the threshold voltage may be shifted to be smaller voltage.

The present invention has been made in view of the above-mentioned circumstance, and an object of the present invention is to provide an organic light emitting diode display which may suppress a back-channel effect.

An organic light emitting diode display according to the present invention includes a thin film transistor including: a substrate; a gate electrode provided on the substrate; a gate insulating film that covers the gate electrode; a first semiconductor film provided on the gate insulating film; a second semiconductor film provided on the first semiconductor film; and a back channel protection insulating film provided on the second semiconductor film, in which: the first semiconductor film has a crystallinity which is higher than a crystallinity of the second semiconductor film; and the back channel protection insulating film includes one of a photosensitive organic insulating film and a photosensitive organic/inorganic hybrid insulating film.

Another organic light emitting diode display according to the present invention includes a thin film transistor including: a substrate; a gate electrode provided on the substrate; a gate insulating film that covers the gate electrode; a first semiconductor film provided on the gate insulating film; a second semiconductor film provided on the first semiconductor film; an ohmic contact film provided on the second semiconductor film; and a back channel protection insulating film provided on the second semiconductor film, in which: the first semiconductor film has a crystallinity which is higher than a crystallinity of the second semiconductor film; and the back channel protection insulating film and the ohmic contact film are formed as a continuous film. Further, the back channel protection insulating film may be formed by one of oxidizing, nitriding, and oxynitriding part of the ohmic contact film.

Further, in the organic light emitting diode display according to the present invention, an amount of fixed charge in the back channel protection insulating film per unit area may be $3.5 \times 10^{11}/cm^2$ or less.

Further, in the organic light emitting diode display according to the present invention, a thickness of the first semiconductor film may be 20 nm or more and 60 nm or less.

Further, in the organic light emitting diode display according to the present invention, a thickness of the second semiconductor film may be 10 nm or more and 50 nm or less.

Further, in the organic light emitting diode display according to the present invention, a concentration of one of phosphorus and boron contained in the second semiconductor film may be $3 \times 10^{16}/cm^3$ or less.

According to the present invention, the thin film transistor used in the organic light emitting diode display which has excellent off-state characteristics, swing characteristics, and saturation characteristics may be attained.

DETAILED DESCRIPTION OF THE INVENTION

Structures and manufacturing methods of thin film transistors according to the present invention and methods of application thereof to an organic light emitting diode display are described in the following with reference to the attached drawings.

Prior to detailed description of embodiments, a structure of a thin film transistor to which the present invention is applied is described.

Figure 1:
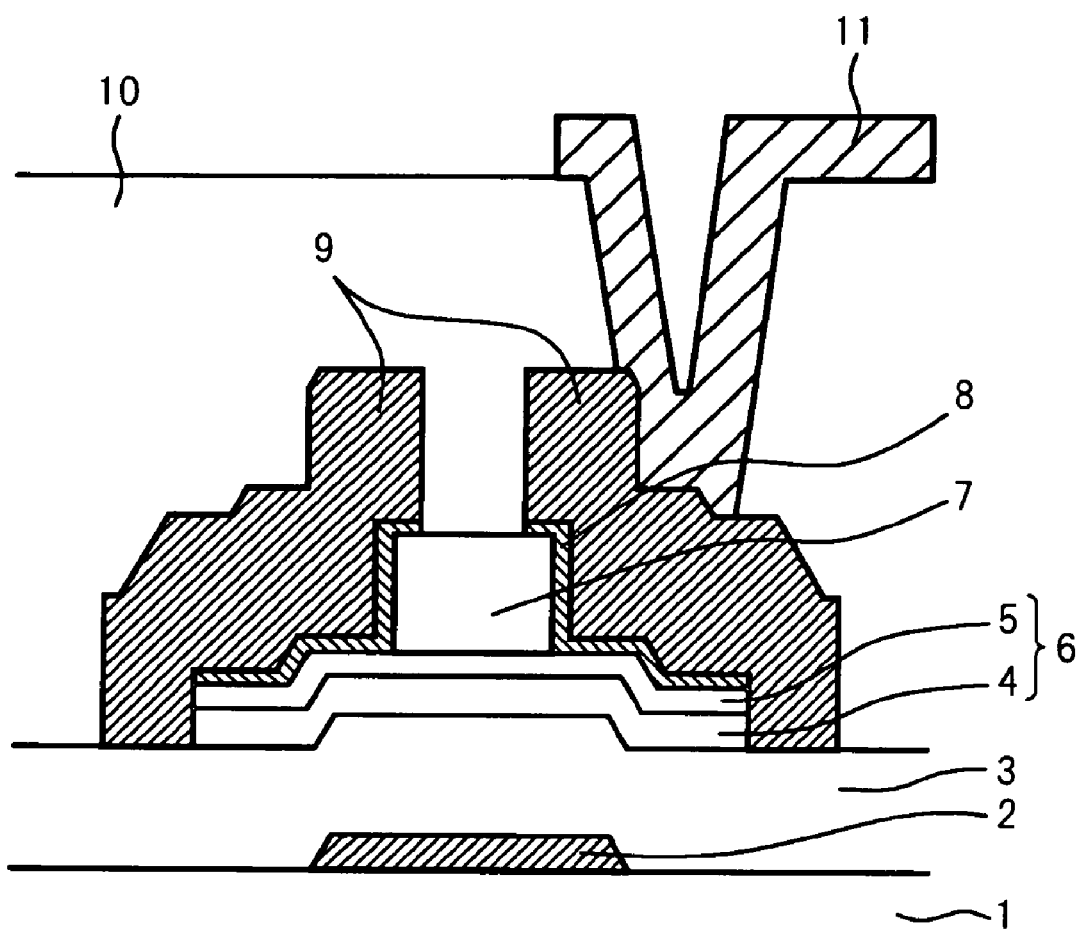
FIG. 1 is a sectional view illustrating a structure of a thin film transistor according to Embodiment 1 of the present invention.

FIG. 1 illustrates a structure of a thin film transistor for an organic light emitting diode display according to Embodiment 1 which is described later. It is to be noted that the section is in a direction of transport of carriers in a conductive layer formed by applying a gate voltage. As illustrated in FIG. 1, a thin film transistor substrate for the organic light emitting diode display according to the present invention includes, on an insulating substrate 1, a gate electrode 2, a gate insulating film 3, a first semiconductor film 4, a second semiconductor film 5, a back channel protection insulating film 7 on an active semiconductor layer 6, the active semiconductor layer 6 being formed by laminating the first semiconductor film 4 and the second semiconductor film 5, an ohmic contact film 8, source/drain electrodes 9, a protective film 10 for protecting the thin film transistor, and a lower electrode 11 of an organic light emitting diode for emitting light. A thin film transistor described herein refers to a portion formed of the gate electrode 2, the gate insulating film 3, the first semiconductor film 4, the second semiconductor film 5, the back channel protection insulating film 7 on the active semiconductor layer 6, the active semiconductor layer 6 being formed by laminating the first semiconductor film 4 and the second semiconductor film 5, the ohmic contact film 8, and the source/drain electrodes 9.

By forming the back channel protection insulating film 7 in this way, effect of fixed charge existing on the active semiconductor layer 6 is lessened, and thus, the back-channel effect may be suppressed. This enables improvement of the transistor characteristics including the off-state characteristics, the swing characteristics, the saturation characteristics, and shift of the threshold voltage.

The back channel protection insulating film 7 is formed of an organic insulating film or an organic/inorganic hybrid insulating film, or, is formed by modifying through oxidizing, nitriding, or oxynitriding part of the ohmic contact film 8 on the active semiconductor layer 6. The organic insulating film or the organic/inorganic hybrid insulating film may be formed as a high-quality insulating film at a low temperature on the active semiconductor layer 6, and thus, formation of fixed charge may be suppressed. When the back channel protection insulating film 7 is formed by modifying through oxidizing, nitriding, or oxynitriding part of the ohmic contact film 8, similarly, a high-quality insulating film may be formed at a low temperature, and thus, formation of fixed charge may be suppressed.

Figure 2:
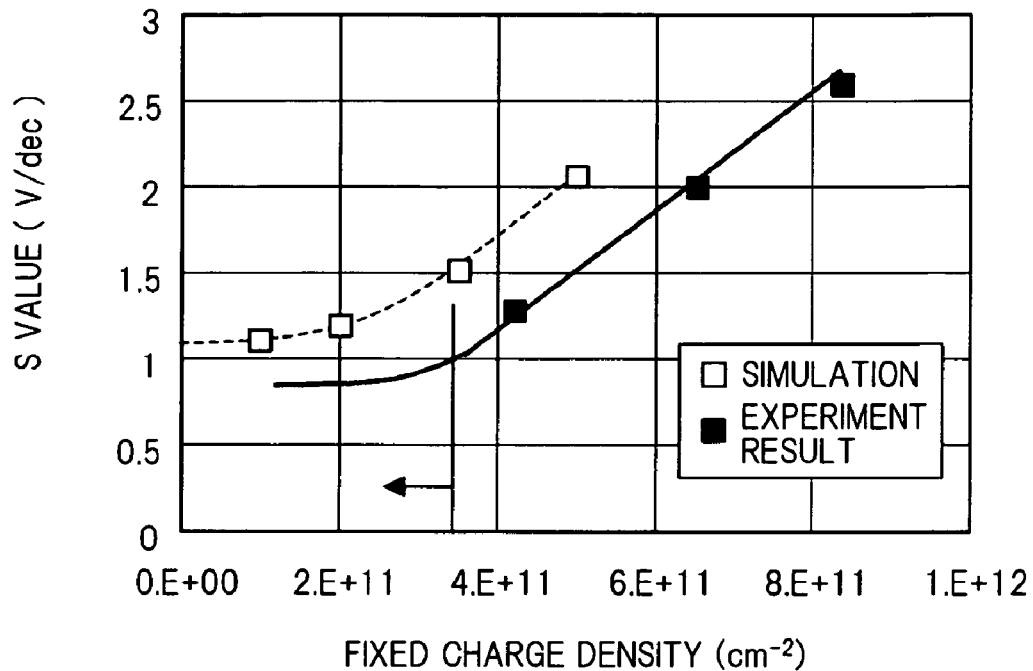
FIG. 2 is a graph showing a relationship between an S value and fixed charge in a back channel protection insulating film.

FIG. 2 shows results of a simulation and of an experiment of a relationship between an amount of fixed charge in the back channel protection insulating film 7 and a subthreshold coefficient (S value) which determines the quality of the swing characteristics. A device structure used in the simulation was the structure of Embodiment 1 described later. N-type microcrystalline silicon having an intrinsic mobility of 10 $cm^2/Vs$ was assumed to be the first semiconductor film 4 and a thickness thereof was set to be 50 nm, while amorphous silicon was assumed to be the second semiconductor film 5 and a thickness thereof was set to be 25 nm. The amount of fixed charge in the back channel protection insulating film 7 was varied and the behavior of the S value was observed. The S values in the result of the experiment were an evaluation of transfer characteristics of the thin film transistor. The amount of fixed charge was obtained by measuring capacitance-voltage characteristics (C-V characteristics) of the back channel protection insulating film 7 used in manufacturing the thin film transistor. It may be said that, as the S value becomes smaller, the swing characteristics become more satisfactory. From the result of the simulation, it may be seen that, as the fixed charge density became lower, the S value became smaller and the characteristics were improved. Further, it may be seen that, when the fixed charge density was sufficiently small, the S value converged on a certain value which was attainable in the case of no effect of fixed charge. The same tendency was observed in the experiment. As indicated by a solid line in FIG. 2, as the fixed charge density became lower, the S value was improved more, and, when the fixed charge density was sufficiently small, the S value converged on a certain value. It is desirable that the S value of a thin film transistor for an OLED display be 1 V/dec or less. In order to achieve an S value of 1 V/dec or less, it is preferred that the amount of fixed charge in the back channel protection insulating film 7 per unit area be $3.5 \times 10^{11}/cm^2$ or less. When the amount of fixed charge existing in the back channel protection insulating film 7 is more than this value, it is conceivable that the back-channel effect may not be suppressed, thereby degrading the transistor characteristics.

The active semiconductor layer 6 includes the first semiconductor film 4 and the second semiconductor film 5 having a crystallinity which is lower than that of the first semiconductor film 4. A high-crystallinity semiconductor film formed of microcrystalline silicon, polysilicon, or the like is more likely to be affected by fixed charge than a low-crystallinity semiconductor layer formed of amorphous silicon or the like. Therefore, by providing the second semiconductor film 5 having a crystallinity which is lower than that of the first semiconductor film 4 on the high-crystallinity first semiconductor film 4, the effect on the first semiconductor film 4 of fixed charge existing on the active semiconductor layer 6 may be lessened to improve the transistor characteristics.

It is preferred that the thickness of the first semiconductor film 4 be 20 nm or more and 60 nm or less. When the thickness of the first semiconductor film 4 is less than 20 nm, it is difficult to obtain a high-quality crystalline film, and therefore, satisfactory transistor characteristics may not be obtained. When the thickness of the first semiconductor film 4 is more than 60 nm, an OFF current increases, and therefore, it is difficult to use the thin film transistor as a switch transistor.

Figure 3:
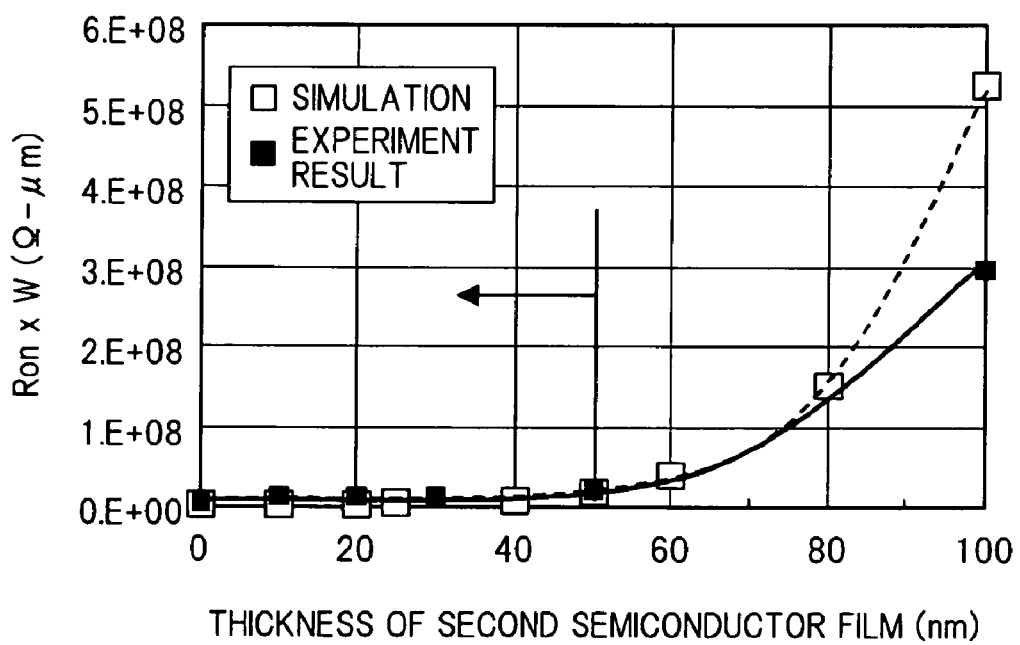
FIG. 3 is a graph showing a relationship between an ON resistance and a thickness of a second semiconductor film.

It is preferred that the thickness of the second semiconductor film 5 having the crystallinity which is lower than that of the first semiconductor film 4 be 10 nm or more and 50 nm or less. When the thickness of the second semiconductor film 5 is less than 10 nm, nonuniformity of the film thickness is caused in a surface of the substrate, to thereby cause fluctuations in the transistor characteristics. When the thickness of the second semiconductor film 5 is more than 50 nm, parasitic resistance due to the thickness of the low-crystallinity second semiconductor film 5 increases, to thereby decrease an ON current and increase an ON resistance. FIG. 3 shows results of a simulation and of an experiment of a relationship between the ON resistance and the thickness of the second semiconductor film 5. The ON resistance (Ron) was calculated from the ON current when a source-drain voltage was 0.1 V and the gate voltage was 20 V. Further, the ON resistance was multiplied by a channel width (W) to be standardized. A device structure used in the simulation was the structure of Embodiment 1 described later. Fitting was carried out based on the transfer characteristics obtained by the result of the experiment, and the ON resistances with respect to the respective film thicknesses were calculated. It may be seen that, as illustrated in FIG. 3, the ON resistance greatly increased when the thickness of the second semiconductor film 5 was more than 50 nm. Therefore, it is preferred that the thickness of the second semiconductor film 5 be 50 nm or less.

Figure 4:
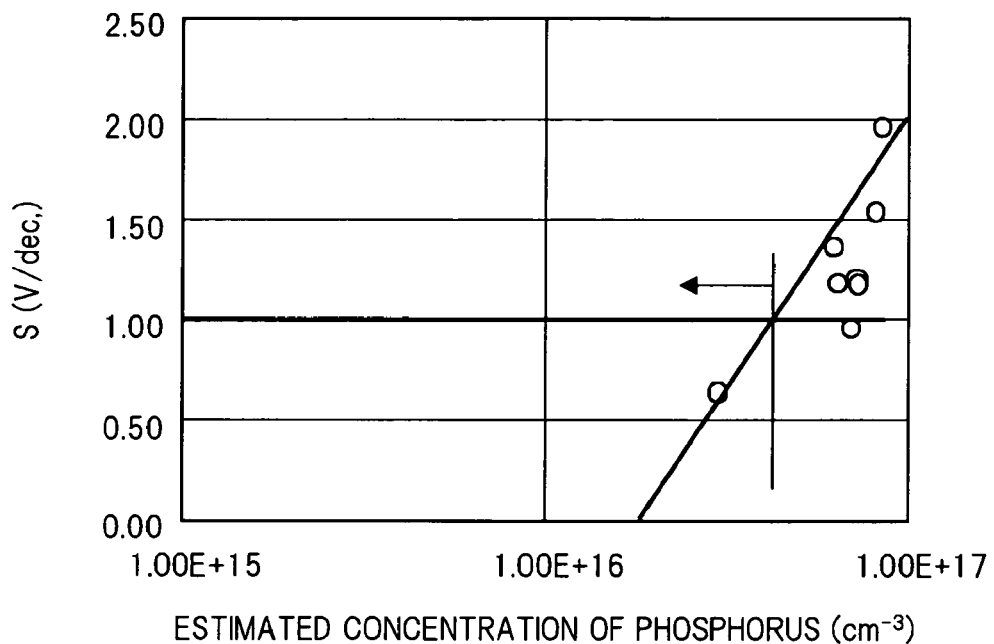
FIG. 4 is a graph showing a relationship between the S value and a concentration of phosphorus in the second semiconductor film.

Further, it is preferred that a concentration of phosphorus or boron contained in the second semiconductor film 5 be $3 \times 10^{16}/cm^3$ or less. This is because, when the low-crystallinity second semiconductor film 5 is contaminated by the above-mentioned impurity, band bending occurs at an interface with the high-crystallinity first semiconductor film 4, to thereby shift the threshold voltage and increase the S value. As an example, FIG. 4 shows a relationship between the concentration of phosphorus and the S value. It is preferred that the S value of a thin film transistor for an OLED display be 1 V/dec or less. In order to achieve an S value of 1 V/dec or less, it is preferred that the concentration of phosphorus be $3 \times 10^{16}/cm^3$ or less.

Embodiments 1 to 6 according to the present invention are described in the following with reference to the attached drawings. It is to be noted that, throughout the figures, like numerals are used to designate like or identical elements and overlapping description thereof is omitted to avoid redundancy.

Embodiment 1

Figure 5:
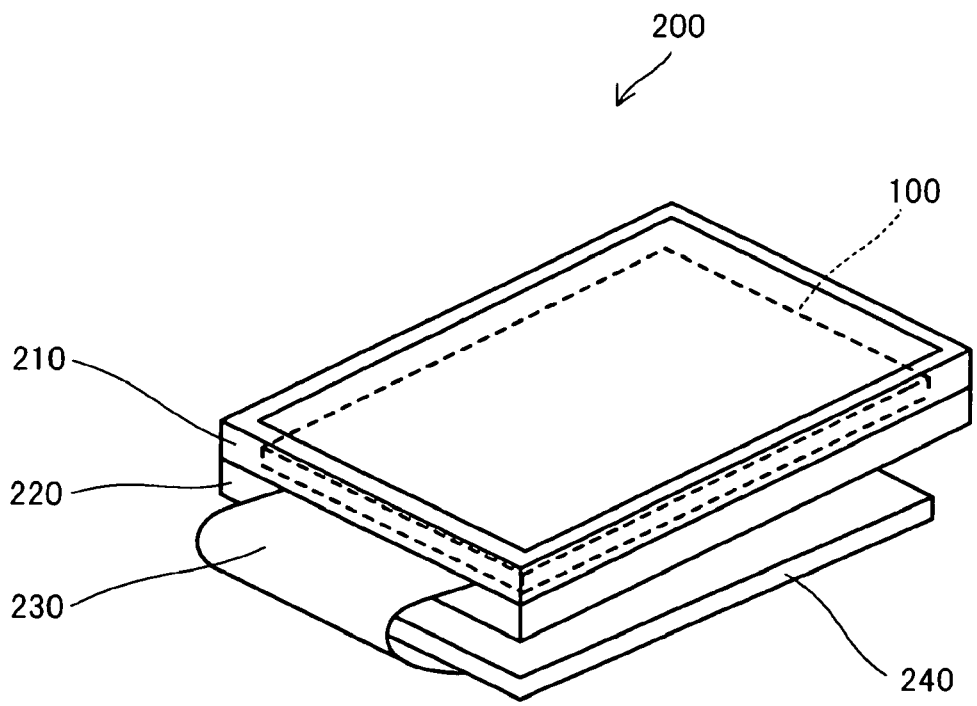
FIG. 5 illustrates an organic light emitting diode display according to Embodiment 1.

FIG. 5 illustrates an organic light emitting diode display 200 according to Embodiment 1 of the present invention. As illustrated in FIG. 5, the organic light emitting diode display 200 includes an upper frame 210 and a lower frame 220 for fixing by sandwiching an OLED panel which includes a thin film transistor substrate 100 and an encapsulating substrate (not shown), a circuit board 240 including a circuit element for generating information to be displayed, and a flexible substrate 230 for conveying to the thin film transistor substrate 100 display information of RGB generated in the circuit board 240.

Figure 6:
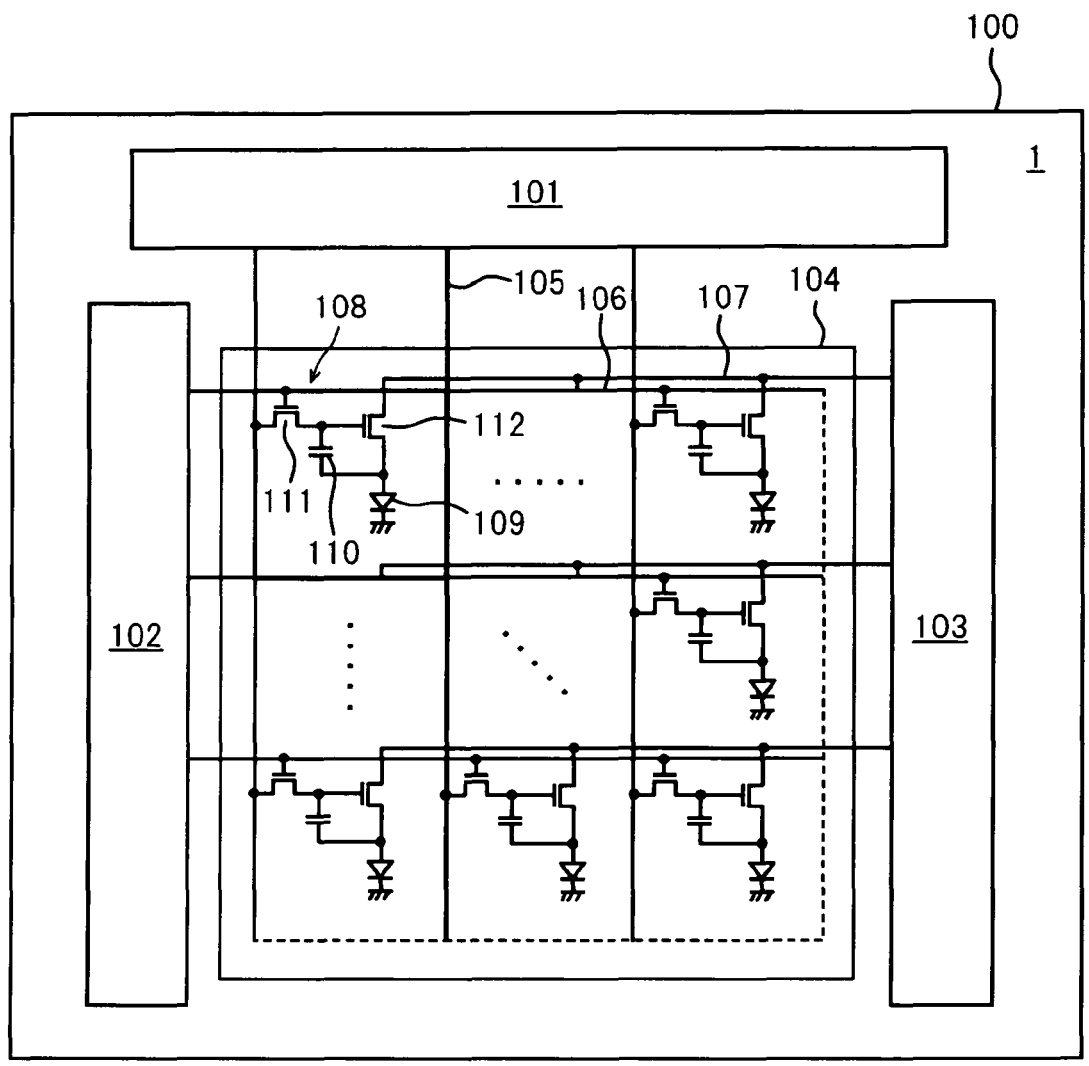
FIG. 6 illustrates a structure of a circuit of a thin film transistor substrate of the organic light emitting diode display illustrated in FIG. 5.

FIG. 6 illustrates a structure of a circuit of the thin film transistor substrate 100 of the organic light emitting diode display 200 illustrated in FIG. 5. As illustrated in FIG. 6, as a basic structure, the thin film transistor substrate 100 includes on the substrate 1 a data driver 101, a selection scanning driver 102, a power supply scanning driver 103, and a display region 104. In the display region 104, pixels 108 partitioned by data lines 105 and selection lines 106 are arranged in matrix. Each of the pixels 108 includes, for example, an organic light emitting diode 109, a storage capacitor 110, and a switch transistor 111 and a drive transistor 112 which are thin film transistors, to thereby form a pixel circuit. The drive transistor 112 is connected to a power line 107 extended from the power supply scanning driver 103. The pixel circuit controls light emission by adjusting and maintaining an amount of current flowing through the organic light emitting diode 109 based on signals output from the data driver 101, the selection scanning driver 102, and the power supply scanning driver 103. It is to be noted that the pixel circuit illustrated in FIG. 6 is only exemplary and the thin film transistor is also applicable to a pixel circuit in which more transistors are provided.

Figure 7:
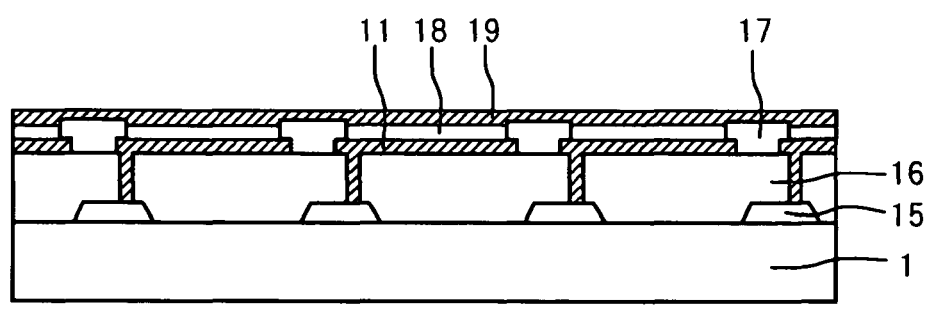
FIG. 7 is a sectional view of a display portion of the thin film transistor substrate illustrated in FIG. 6.

FIG. 7 is a sectional view of the display region 104 for illustrating a principle of light emission of the thin film transistor substrate 100. It is to be noted that a thin film transistor 15 illustrated in FIG. 7 is the drive transistor 112 illustrated in FIG. 6, and the switch transistor 111 and the storage capacitor 110 are omitted. As illustrated in FIG. 7, the thin film transistor substrate 100 of the organic light emitting diode display according to the present invention includes on the substrate 1 the thin film transistor 15, a first insulating film 16, the lower electrode 11, a second insulating film 17, an OLED layer 18, and an upper electrode 19. The OLED layer 18 is formed by a mask vapor deposition method, an ink jet method, or the like after the lower electrode 11 and the second insulating film 17 are patterned and partitions are formed. The OLED layer 18 includes, for example, an electron injection layer, an electron transport layer, a light-emitting layer, a hole transport layer, and a hole injection layer. The upper electrode 19 and the lower electrode 11 are used as a cathode and an anode depending on the kinds of the carriers injected into the OLED layer 18. More specifically, an electrode for injecting electrons is the cathode while the other electrode for injecting holes is the anode.

When the thin film transistor 15 is operated, electrons and holes are injected from the upper electrode 19 and the lower electrode 11 through the electron injection layer and the hole injection layer. The electrons are allowed to flow through the electron transport layer while the holes are allowed to flow through the hole transport layer. The electrons and the holes are combined in the light-emitting layer, and light is emitted.

Figure 8:
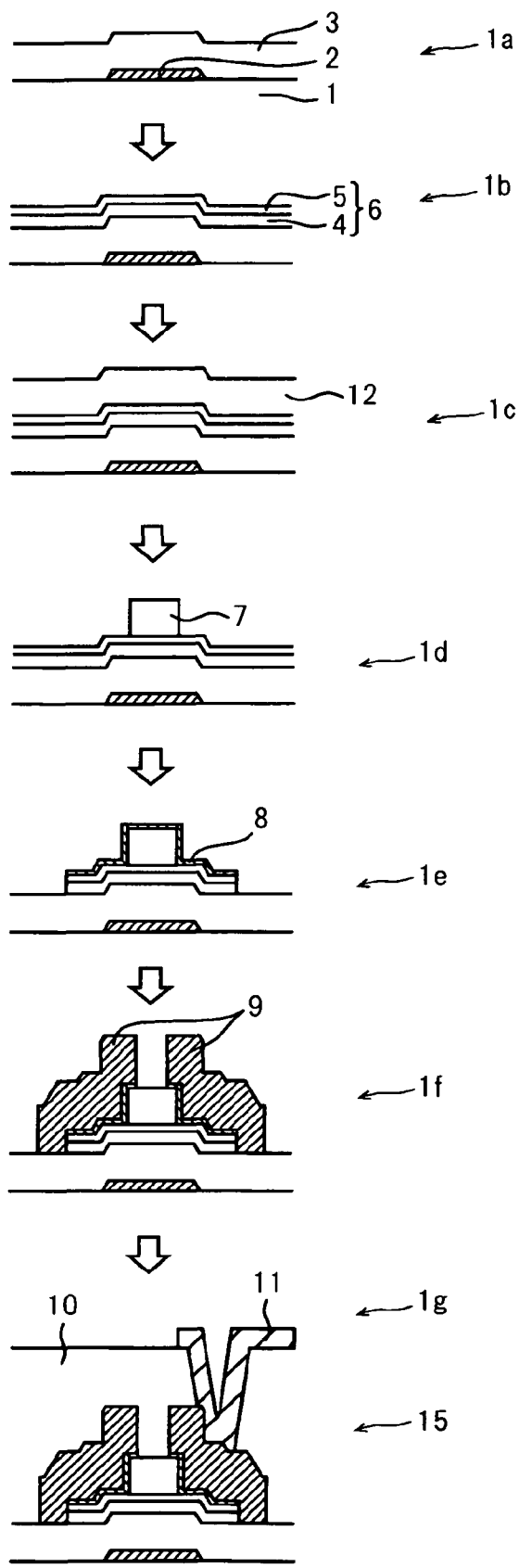
FIG. 8 illustrates sectional views of manufacturing process steps of the thin film transistor of the organic light emitting diode display according to Embodiment 1.

FIG. 8 illustrates sectional views of respective manufacturing process steps of the thin film transistor 15. In the manufacturing process steps of the thin film transistor 15, first, as illustrated in a step 1a of FIG. 8, a molybdenum tungsten (MoW) film is formed at a thickness of 50 nm by sputtering on the substrate 1 which is formed of an insulating material such as glass. After a photolithography step is performed, patterning is carried out by wet etching to form the gate electrode 2. When treatment at a high temperature, for example, at 400° C. or higher, is required at a subsequent step, the gate electrode 2 is required to be highly heat-resistant, that is, the resistance value of the gate electrode 2 is required to be constant even at a desired high temperature. Then, the gate insulating film 3 formed of a silicon oxide film ($SiO_x$) is formed at a thickness of, for example, 170 nm by plasma CVD. As the gate insulating film 3, a silicon nitride film ($SiN_x$) or a layer formed by laminating a silicon nitride film and a silicon oxide film may also be used. However, when the quality of the gate insulating film 3 is low, fixed charge is formed in the film to degrade the transistor characteristics. Therefore, it is preferred that the gate insulating film 3 be formed under conditions for forming a high-quality insulating film, for example, at 300° C. or higher.

Next, as illustrated in a step 1b, the active semiconductor layer 6 which is formed by laminating the high-crystallinity first semiconductor film 4 and the low-crystallinity second semiconductor film 5 is formed on the gate insulating film 3. The high-crystallinity first semiconductor film 4 described here refers to microcrystalline silicon, polysilicon, or the like. Microcrystalline silicon may be formed by, for example, various kinds of CVD methods including Plasma Enhancement (PE)-CVD, catalytic (Cat)-CVD, and reaction heat CVD. Alternatively, an amorphous silicon film may be formed and then annealing may be carried out using a laser, a furnace, or the like to form microcrystalline silicon or polysilicon. In this embodiment, the first semiconductor film 4 is formed by, after forming an amorphous silicon film, preparing microcrystalline silicon by heat treatment (Rapid Thermal Annealing (RTA)). The grain size of the obtained microcrystalline silicon is about 30 nm, which is sufficiently smaller than a channel region of the thin film transistor. Therefore, this is appropriate for an organic light emitting diode display which is required to have uniform transistor characteristics over the entire substrate. It is to be noted that the thickness of the first semiconductor film 4 is preferably 20 nm or more and 60 nm or less. This is because, when the thickness of the first semiconductor film 4 is less than 20 nm, it is difficult to obtain a satisfactory crystalline semiconductor film, while, when the thickness of the first semiconductor film 4 is more than 60 nm, it is difficult to secure a sufficiently low OFF current. Then, the second semiconductor film 5 having the crystallinity which is lower than that of the first semiconductor film 4 is formed on the first semiconductor film 4. The second semiconductor film 5 having the crystallinity which is lower than that of the first semiconductor film 4 is formed of amorphous silicon, microcrystalline silicon having the crystallinity which is lower than that of the first semiconductor film 4 and being formed by CVD, or a layer formed by laminating thereof. It is to be noted that, if necessary, hydrogen plasma treatment may be additionally carried out after cleaning with a hydrogen-fluoride-based chemical solution and before the second semiconductor film 5 is formed. In this manner, dangling bonds which remain in the high-crystallinity first semiconductor film 4 are terminated by hydrogen, and as a result, the transistor characteristics may be improved. In this embodiment, as the second semiconductor film 5, an amorphous silicon film is formed at a thickness of 30 nm by PE-CVD. It is preferred that the thickness of the second semiconductor film 5 be 10 nm or more and 50 nm or less. This is because, when the thickness of the low-crystallinity second semiconductor film 5 is less than 10 nm, fluctuations in characteristics in the substrate become larger, while, when the thickness of the low-crystallinity second semiconductor film 5 is more than 50 nm, parasitic resistance due to the thickness of the second semiconductor film 5 increases and the ON current decreases. Further, it is preferred that the concentration of phosphorus or boron contained in the second semiconductor film 5 be $3\times10^{16}/cm^3$ or less. This is because, when the second semiconductor film 5 is contaminated by the above-mentioned impurity, band bending occurs at the interface with the first semiconductor film 4, and the swing characteristics are degraded, and the threshold voltage is shifted.

Next, as illustrated in a step 1c, a photosensitive organic insulating film or organic/inorganic hybrid insulating film 12 is applied. The material of the film 12 may be, for example, photosensitive benzo-cyclo-butene (BCB) or spin on glass (SOG). After that, patterning is carried out by exposure and development, and annealing at about 200 to 300° C. is carried out to form the back channel protection insulating film 7 on the active semiconductor layer 6 (step 1d). By using such a material, a satisfactory insulating film having less fixed charge may be formed at a low temperature. The back channel protection insulating film 7 is a layer provided for the purpose of lessening the effect of fixed charge on the active semiconductor layer 6. Therefore, it is preferred that the amount of fixed charge in the film per unit area be $3.5\times10^{11}/cm^2$ or less. This is because, when the amount of fixed charge existing on the active semiconductor layer 6 is more than the above-mentioned value, the swing characteristics, the off-state characteristics, and the saturation characteristics are degraded, and the threshold voltage is shifted.

Then, as illustrated in a step 1e, an n-type amorphous silicon film containing phosphorus is formed at a thickness of 25 nm by PE-CVD as the ohmic contact film 8. After a photolithography step is performed, patterning is carried out by dry etching. Here, the active semiconductor layer 6 thereunder is patterned at the same time.

Then, as illustrated in a step 1f, a laminated film including three layers of molybdenum tungsten (MoW), aluminum (Al), molybdenum tungsten (MoW) having thicknesses of 38 nm, 500 nm, 75 nm, respectively, is formed in the stated order. After a photolithography step is performed, patterning is carried out by wet etching to form the source/drain electrodes 9. After that, a resist used in forming the source/drain electrodes 9 is used as it is, and the ohmic contact film 8 formed of n-type amorphous silicon is removed by dry etching. Here, the back channel protection insulating film 7 also serves as an etch stopper for protecting the active semiconductor layer 6 from the dry etching.

Then, as illustrated in a step 1g, the protective film 10 formed of a silicon nitride film is formed at a thickness of about 400 nm by PE-CVD. After a photolithography step is performed, a contact hole is formed. After that, the lower electrode 11 formed of an indium tin oxide (ITO) film or the like is formed at a thickness of about 150 nm by sputtering. After a photolithography step is performed, patterning is carried out. In this way, the thin film transistor 15 for the organic light emitting diode display 200 according to Embodiment 1 may be manufactured.

Therefore, in the thin film transistor 15 for the organic light emitting diode display 200 according to Embodiment 1, by forming the back channel protection insulating film 7 having less fixed charge on the active semiconductor layer 6, the back-channel effect may be suppressed. This enables the off-state characteristics, the swing characteristics, and the saturation characteristics to be satisfactory, and the shift of the threshold voltage may be improved. Further, by using the back channel protection insulating film 7 also as the etch stopper, overetching of the active semiconductor layer 6, which occurs when the ohmic contact film 8 is removed, may be prevented. This enables setting of the high-crystallinity semiconductor film 4 and the low-crystallinity semiconductor film 5 at desired thicknesses, respectively, and satisfactory on-state characteristics and off-state characteristics may be attained.

Embodiment 2

Figure 9:
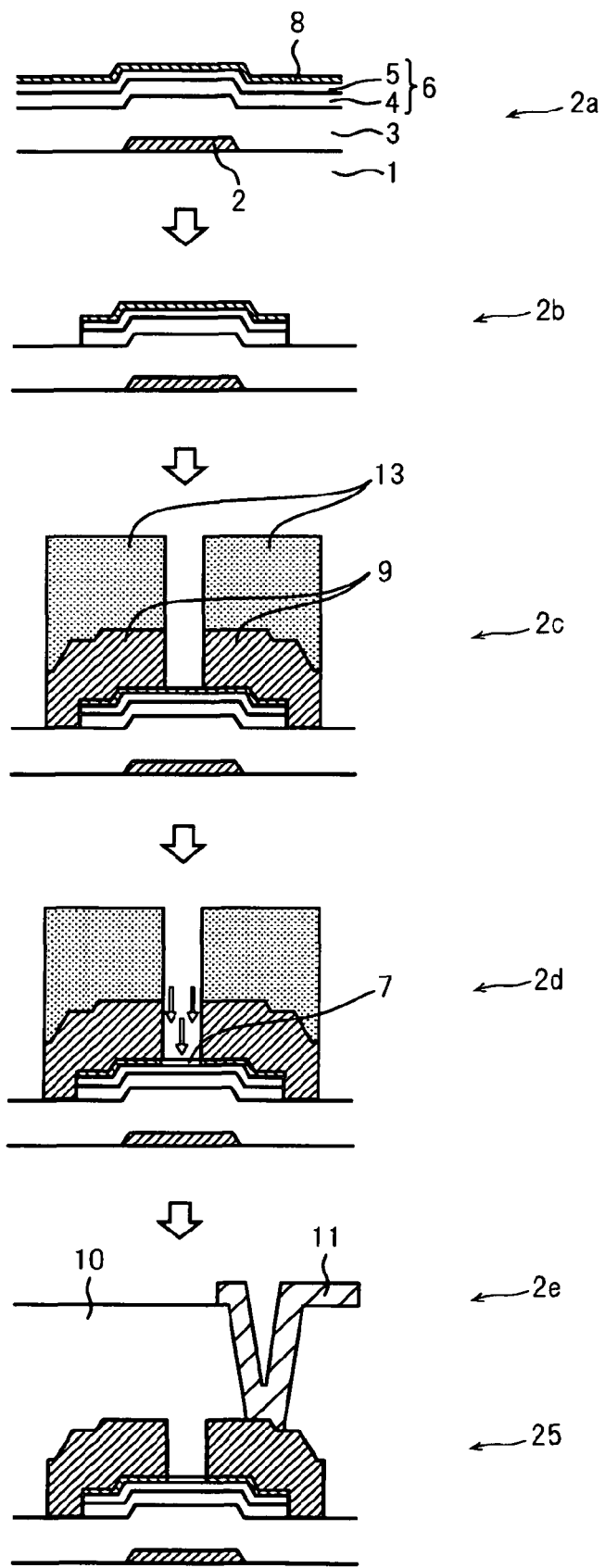
FIG. 9 illustrates sectional views of manufacturing process steps of the thin film transistor of an organic light emitting diode display according to Embodiment 2.

FIG. 9 illustrates sectional views of respective manufacturing process steps of a thin film transistor 25 of an organic light emitting diode display according to Embodiment 2 of the present invention. It is to be noted that the structure of the organic light emitting diode display in which the thin film transistor is used is similar to those of the organic light emitting diode display 200 illustrated in FIG. 5 and of the thin film transistor substrate 100 illustrated in FIGS. 6 and 7 according to Embodiment 1, therefore, description thereof is omitted.

A method of manufacturing the thin film transistor 25 according to this embodiment is characterized in that, after the source/drain electrodes 9 are patterned, part of the ohmic contact film 8 on the active semiconductor layer 6 is plasma oxidized to form the back channel protection insulating film 7. It is to be noted that part of description of this embodiment which is similar to that of Embodiment 1 is omitted.

First, as illustrated in a step 2a of FIG. 9, similarly to the case of Embodiment 1, the gate electrode 2 is formed on the substrate 1 which is formed of an insulating material such as glass, and then, the gate insulating film 3 is formed. Next, the active semiconductor layer 6 including the first semiconductor film 4 and the second semiconductor film 5 is formed on the gate insulating film 3. After that, an n-type amorphous silicon film containing phosphorus is formed on the active semiconductor layer 6 at a thickness of 10 nm by PE-CVD as the ohmic contact film 8.

Then, as illustrated in a step 2b, after a photolithography step is performed, a film including the active semiconductor layer 6 and the ohmic contact film 8 is patterned by dry etching.

Then, as illustrated in a step 2c, similarly to the case of Embodiment 1, the source/drain electrodes 9 are formed on the film including the active semiconductor layer 6 and the ohmic contact film 8. After that, as illustrated in a step 2d, a resist 13 used in forming the source/drain electrodes 9 is used as a mask, and oxygen plasma treatment is carried out to part of the ohmic contact film 8 which is in a channel region sandwiched between the source/drain electrodes 9 to modify the part into an insulating film. In this way, the back channel protection insulating film 7 having less fixed charge may be formed at a low temperature.

Then, as illustrated in a step 2e, the protective film 10 formed of a silicon nitride film is formed at a thickness of about 400 nm by PE-CVD. After a photolithography step is performed, a contact hole is formed. After that, the lower electrode 11 which is an indium tin oxide (ITO) film or the like is formed at a thickness of about 150 nm by sputtering. After a photolithography step is performed, patterning is carried out. In this way, the thin film transistor 25 for the organic light emitting diode display according to Embodiment 2 is manufactured.

In the thin film transistor 25 according to Embodiment 2, because the ohmic contact film 8 is oxidized to form the back channel protection insulating film 7, formation of fixed charge in the back channel protection insulating film 7 may be suppressed. This suppresses the back-channel effect, and the thin film transistor which has excellent off-state characteristics, swing characteristics, and saturation characteristics and in which the shift of the threshold voltage is small may be manufactured. Further, because the resist 13 for the source/drain electrodes 9 is used to form the back channel protection insulating film 7, the number of the photolithography steps may be reduced by one, and the cost of manufacturing may be reduced accordingly.

Embodiment 3

Figure 10:
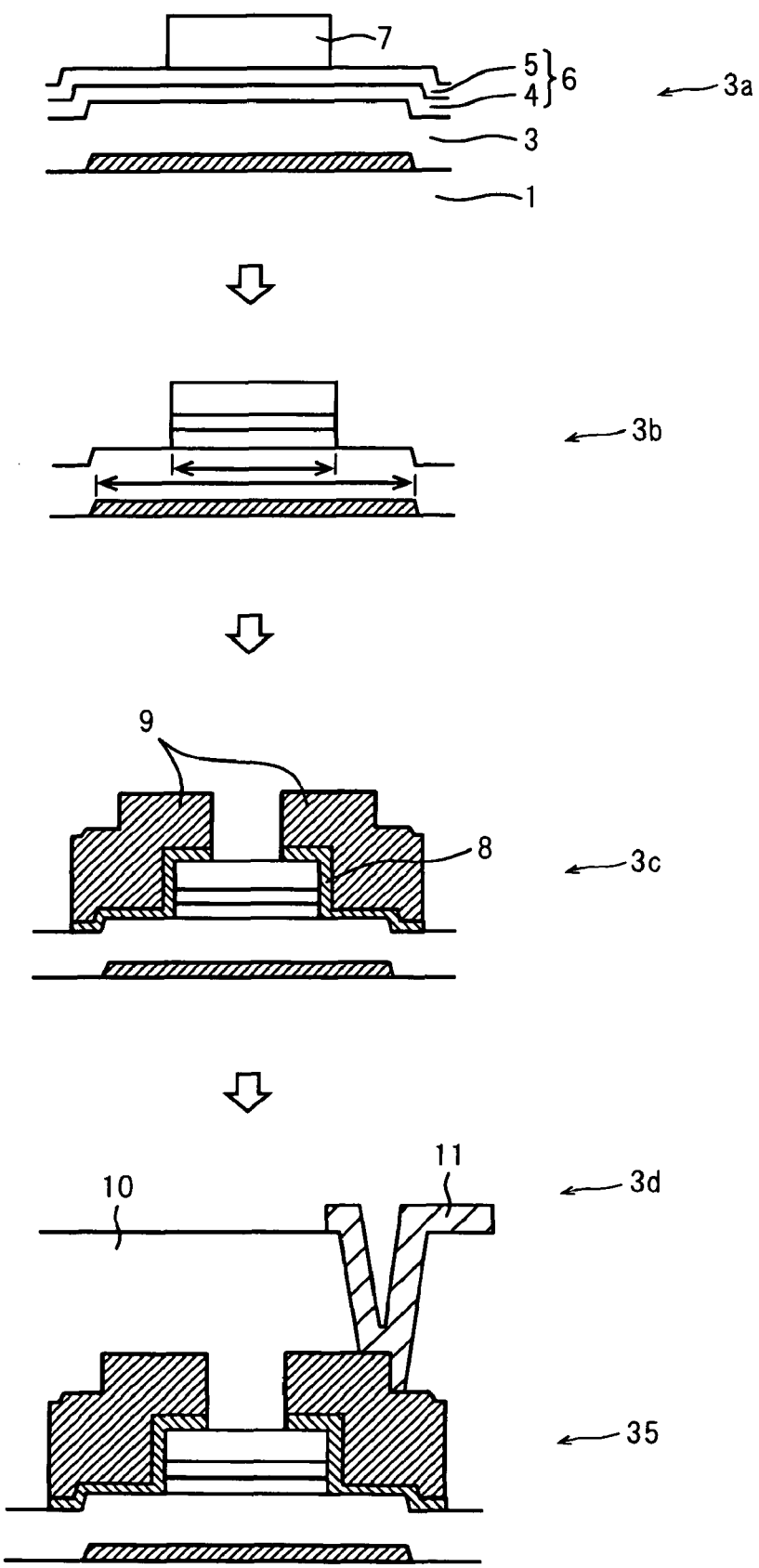
FIG. 10 illustrates sectional views of manufacturing process steps of the thin film transistor of an organic light emitting diode display according to Embodiment 3.

FIG. 10 illustrates sectional views of respective manufacturing process steps of a thin film transistor 35 of an organic light emitting diode display according to Embodiment 3 of the present invention. It is to be noted that the structure of the organic light emitting diode display in which the thin film transistor 35 is used is similar to those of the organic light emitting diode display 200 illustrated in FIG. 5 and of the thin film transistor substrate 100 illustrated in FIGS. 6 and 7 according to Embodiment 1, therefore, description thereof is omitted.

FIG. 10 illustrates sectional views of respective manufacturing process steps of the thin film transistor 35 according to Embodiment 3 of the present invention. A method of manufacturing the thin film transistor 35 according to this embodiment is characterized in that the number of photolithography steps necessary for the manufacture may be reduced and still the on-state characteristics is excellent. It is to be noted that part of description of this embodiment which is similar to that of Embodiment 1 is omitted.

First, as illustrated in a step 3a of FIG. 10, similarly to the case of Embodiment 1, the gate electrode 2 is formed on the substrate 1 which is formed of an insulating material such as glass, and then, the gate insulating film 3 is formed. Next, the active semiconductor layer 6 including the first semiconductor film 4 and the second semiconductor film 5 is formed on the gate insulating film 3. Then, a photosensitive organic insulating film or organic/inorganic hybrid insulating film is applied. After that, patterning is carried out by exposure and development and annealing is carried out to form the back channel protection insulating film 7 on the active semiconductor layer 6.

Next, as illustrated in a step 3b, the back channel protection insulating film 7 is used as a mask, and the active semiconductor layer 6 is island-like patterned by dry etching. Here, as illustrated in the step 3b, the patterning is carried out such that the width of the active semiconductor layer 6 is smaller than that of the gate electrode 2. This causes direct connection between the conductive layer formed in the first semiconductor film 4 and the ohmic contact film 8 when a gate voltage is applied, and therefore, there is no effect of parasitic resistance due to the thickness of the second semiconductor film 5. It is to be noted that the width of the active semiconductor layer 6 illustrated in the step 3b is the channel length.

Then, as illustrated in a step 3c, the ohmic contact film 8 and the source/drain electrodes 9 are formed on the active semiconductor layer 6. Here, a resist used in forming the source/drain electrodes 9 is used as it is as a mask in patterning the ohmic contact film 8. The back channel protection insulating film 7 on the active semiconductor layer 6 also serves as an etch stopper.

Then, as illustrated in a step 3d, the protective film 10 which is a silicon nitride film is formed by PE-CVD. After a photolithography step is performed, a contact hole is formed. After that, the lower electrode 11 is formed by sputtering. After a photolithography step is performed, patterning is carried out. In this way, the thin film transistor 35 for the organic light emitting diode display according to Embodiment 3 is manufactured.

In the thin film transistor 35 according to Embodiment 3, by using the back channel protection insulating film 7 also as the mask in patterning the active semiconductor layer 6, the number of the photolithography steps may be smaller by one than that in Embodiment 1. Further, by carrying out the patterning such that the width of the active semiconductor layer 6 is smaller than that of the gate electrode 2, the conductive layer formed by field effect is directly connected to the ohmic contact film 8. Therefore, there is no effect of parasitic resistance due to the thickness of the second semiconductor film 5, and excellent on-state characteristics may be attained. It is to be noted that, even when, in the device structure according to this embodiment, the OFF current increases and a value required by the design is not attained, it is possible to decrease the OFF current by forming the ohmic contact film 8 so as to have a two-layer structure including a low impurity concentration layer and a high impurity concentration layer from the side of the active semiconductor layer 6. The thin film transistor according to this embodiment is particularly effective as a drive transistor of an organic light emitting diode display.

Embodiment 4

Figure 11:
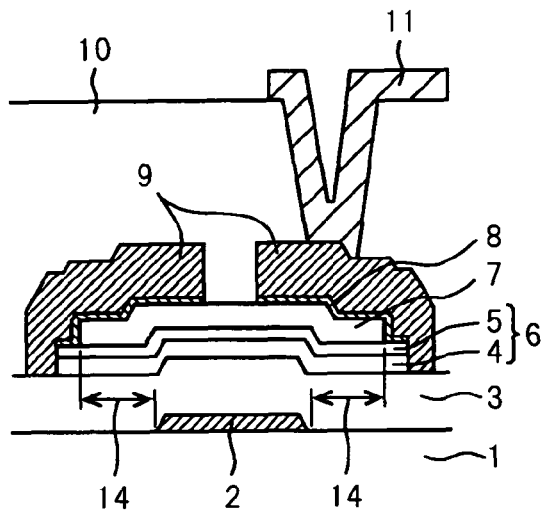
FIG. 11 is a sectional view illustrating a structure of a thin film transistor according to Embodiment 4.

FIG. 11 is a sectional view of a thin film transistor of an organic light emitting diode display according to Embodiment 4 of the present invention. This embodiment is characterized in that, although the thin film transistor is formed through the manufacturing process steps according to Embodiment 1, offset widths 14 are provided by making the width of the back channel protection insulating film 7 larger than that of the gate electrode 2 such that the OFF current may be decreased. An offset width described here refers to a difference between the width of the back channel protection insulating film 7 on the side of a source electrode (drain electrode) and the width of the gate electrode 2. The only difference from the manufacturing process steps according to Embodiment 1 is that, in patterning the back channel protection insulating film 7, the width thereof is formed larger than that of the gate electrode 2.

Embodiment 5

Figure 12:
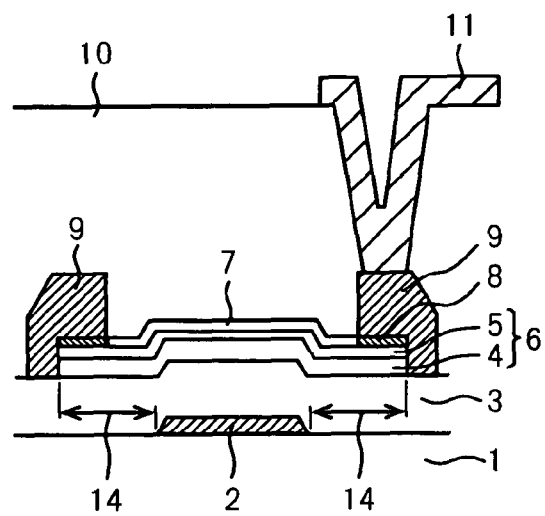
FIG. 12 is a sectional view illustrating a structure of a thin film transistor according to Embodiment 5.

FIG. 12 is a sectional view of a thin film transistor of an organic light emitting diode display according to Embodiment 5 of the present invention. This embodiment is characterized in that, although the thin film transistor is formed through the manufacturing process steps according to Embodiment 2, the offset widths 14 are provided by making the width of the back channel protection insulating film 7 larger than that of the gate electrode 2 so that the OFF current may be decreased. The only difference from the manufacturing process steps according to Embodiment 2 is that, in forming the source/drain electrodes 9, the distance between the source/drain electrodes 9 is formed larger than the width of the gate electrode 2. With this, as illustrated in FIG. 12, the offset widths 14 are provided between the gate electrode 2 and the back channel protection insulating film 7 formed by modifying the ohmic contact film 8 by plasma oxidation.

Embodiment 6

Figure 13:
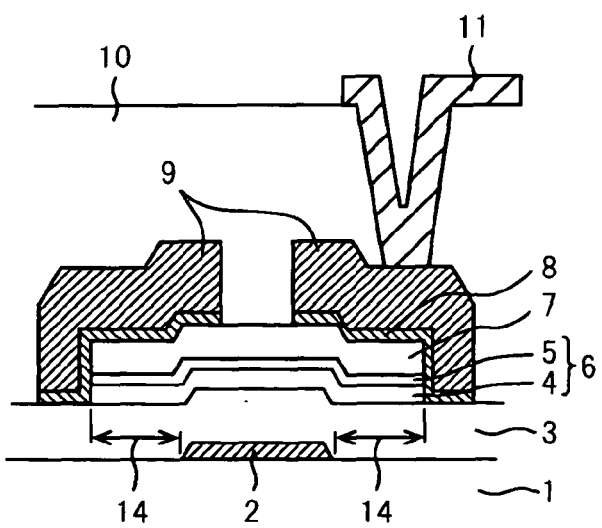
FIG. 13 is a sectional view illustrating a structure of a thin film transistor according to Embodiment 6.
Figure 14:
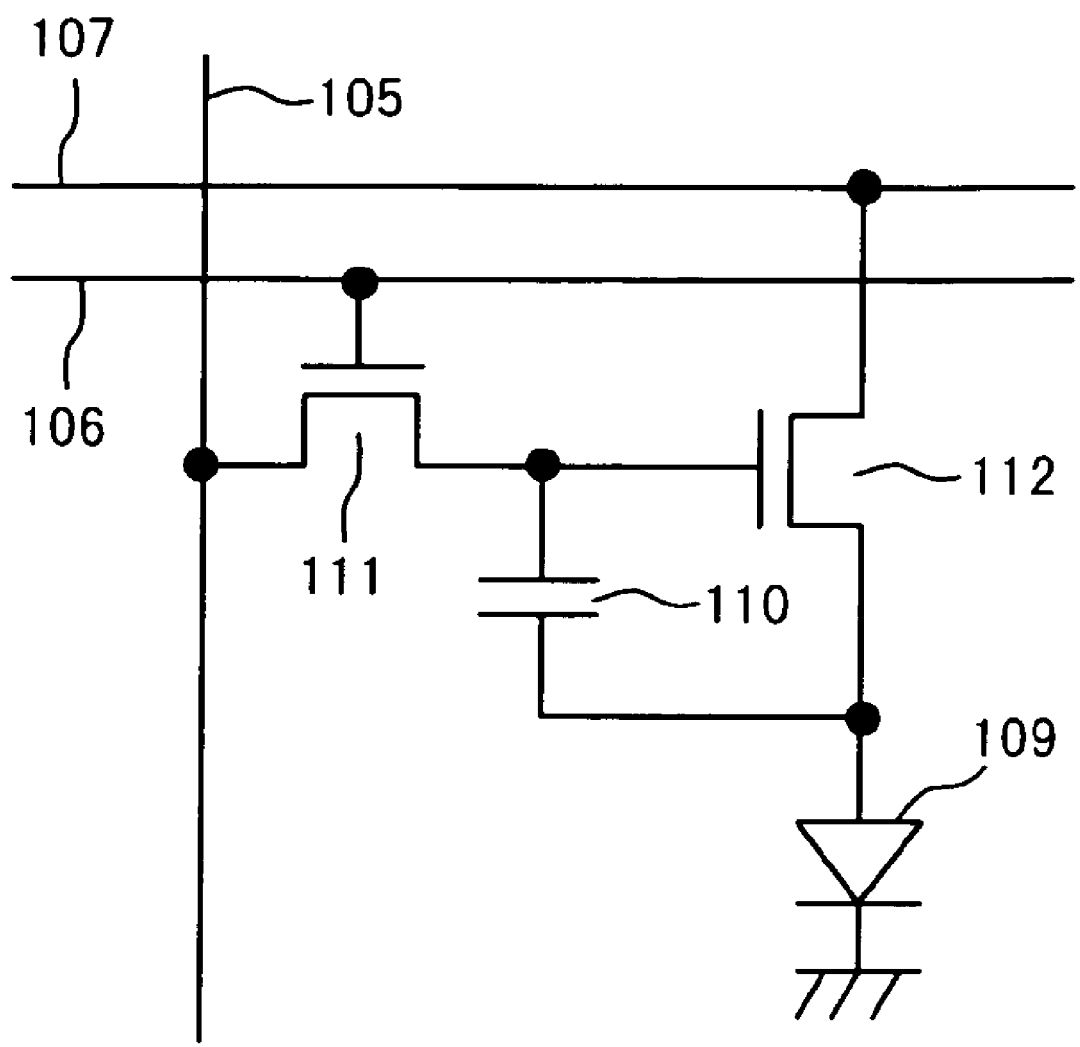
FIG. 14 illustrates an exemplary structure of one pixel circuit of an organic light emitting diode display.

FIG. 13 is a sectional view of a thin film transistor of an organic light emitting diode display according to Embodiment 6 of the present invention. The thin film transistor according to this embodiment is a thin film transistor having the offset widths 14 formed through the manufacturing process steps according to Embodiment 3. The only difference from the manufacturing process steps according to Embodiment 3 is that, in patterning the back channel protection insulating film 7, the width thereof is formed larger than that of the gate electrode 2.

As described in Embodiments 4 to 6, by providing the offset widths 14, the active semiconductor layer 6 existing between the ohmic contact film 8 and the conductive layer formed when a gate voltage is applied functions as a field relaxation layer, and the OFF current may be decreased without an additional process step. The structure is particularly effective in a switch transistor which is required to attain a low OFF current value. The offset widths 14 are within a range with which the required OFF current value may be attained, and it is preferred that the offset widths 14 be 1 μm to 5 μm. This is because, when the offset widths 14 are less than 1 μm, fluctuations in the transistor characteristics due to an error of processing dimensions are caused, while, when the offset widths 14 are more than 5 μm, the ON current greatly decreases.

According to the embodiments described above, a thin film transistor which has excellent off-state characteristics, swing characteristics, and saturation characteristics and in which the shift of the threshold voltage is small may be attained. Therefore, by using the thin film transistor in the organic light emitting diode display, a high contrast ratio, low power consumption, and suppression of fluctuations in brightness may be attained, and hence the performance of the display may be higher.

It is to be noted that the thin film transistors of an organic light emitting diode display according to the present invention are applicable both to a top emission organic light emitting diode display in which emitted light is taken out from the side of the upper electrode and a bottom emission organic light emitting diode display in which emitted light is taken out from the side of the lower electrode, and further, are applicable to an organic light emitting diode display using a color filter.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic light emitting diode display which comprises a thin film transistor, the thin film transistor comprising:
    a substrate;
    a gate electrode provided on the substrate;
    a gate insulating film that covers the gate electrode;
    a first semiconductor film provided on the gate insulating film;
    a second semiconductor film provided on the first semiconductor film; and
    a back channel protection insulating film provided on the second semiconductor film, wherein:
    the first semiconductor film has a crystallinity which is higher than a crystallinity of the second semiconductor film;
    the back channel protection insulating film comprises one of a photosensitive organic insulating film and a photosensitive organic/inorganic hybrid insulating film; and
    the second semiconductor film contains a concentration of one of phosphorus and boron in a range of greater than 0 and not greater than $3 \times 10^{16}/cm^3$.

2. The organic light emitting diode display according to claim 1, wherein an amount of fixed charge in the back channel protection insulating film per unit area is $3.5 \times 10^{11}/cm^2$ or less.

3. The organic light emitting diode display according to claim 1, wherein a thickness of the first semiconductor film is 20 nm or more and 60 nm or less.

4. The organic light emitting diode display according to claim 1, wherein a thickness of the second semiconductor film is 10 nm or more and 50 nm or less.

5. The organic light emitting diode display according to claim 1, wherein:
    the first semiconductor film, and the second semiconductor film and the back channel protection insulating film have substantially the same pattern; and
    ohmic contact films are in contact with the first and second semiconductor film at a side wall portion of the first and second semiconductor films.

6. The organic light emitting diode display according to claim 5, wherein the first and second semiconductor films and the back channel protection insulating film have a width larger than a width of the gate electrode at least in a first direction.

7. The organic light emitting diode display according to claim 6, wherein a distance between an edge of the gate electrode in the first direction and an edge of the back channel protection insulating film in the first direction is 1 μm to 5 μm.

8. An organic light emitting diode display which comprises a thin film transistor, the thin film transistor comprising:
    a substrate;
    a gate electrode provided on the substrate;
    a gate insulating film that covers the gate electrode;
    a first semiconductor film provided on the gate insulating film;
    a second semiconductor film provided on the first semiconductor film;
    an ohmic contact film provided on the second semiconductor film; and
    a back channel protection insulating film provided on the second semiconductor film, wherein:
    the first semiconductor film has a crystallinity which is higher than a crystallinity of the second semiconductor film;
    a center portion of the back channel protection insulating film has a concentration of phosphorus; and
    the back channel protection insulating film and the ohmic contact film are formed as a continuous film.

9. The organic light emitting diode display according to claim 8, wherein the back channel protection insulating film is formed by one of oxidizing, nitriding, and oxynitriding part of the ohmic contact film.

10. The organic light emitting diode display according to claim 8, wherein an amount of fixed charge in the back channel protection insulating film per unit area is $3.5 \times 10^{11}/cm^2$ or less.

11. The organic light emitting diode display according to claim 6, wherein a thickness of the first semiconductor film is 20 nm or more and 60 nm or less.

12. The organic light emitting diode display according to claim 8, wherein a thickness of the second semiconductor film is 10 nm or more and 50 nm or less.

13. The organic light emitting diode display according to claim 8, wherein the second semiconductor film contains a concentration of one of phosphorus and boron in a range of greater than 0 and not greater than $3\times10^{16}/cm^3$.

14. The organic light emitting diode display according to claim 1, wherein the first and second semiconductor films and the back channel protection insulating film have a width larger than a width of the gate electrode at least in a first direction; and the width of the back channel protection insulating film in the first direction is smaller than the width of the first and second semiconductor films in the first direction.

15. The organic light emitting diode display according to claim 14, wherein a distance between an edge of the gate electrode in the first direction and an edge of the back channel protection insulating film in the first direction is 1 μm to 5 μm.

* * * * *